United States Patent
Yao et al.

(10) Patent No.: US 8,058,117 B2
(45) Date of Patent: Nov. 15, 2011

(54) METHOD OF SYNTHESIZING SILICON WIRES

(75) Inventors: Yuan Yao, Beijing (CN); Li-Guo Xu, Beijing (CN); Shou-Shan Fan, Beijing (CN)

(73) Assignees: Tsinghua University, Beijing (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 0 days.

(21) Appl. No.: 12/589,468

(22) Filed: Oct. 23, 2009

(65) Prior Publication Data

US 2010/0041217 A1     Feb. 18, 2010

Related U.S. Application Data

(62) Division of application No. 11/525,440, filed on Sep. 22, 2006, now Pat. No. 7,825,036.

(30) Foreign Application Priority Data

Jan. 14, 2006 (CN) .......................... 2006 1 0032947

(51) Int. Cl.
*H01L 21/00* (2006.01)
(52) U.S. Cl. ...................................................... 438/162
(58) Field of Classification Search ................... 438/162
See application file for complete search history.

(56) References Cited

U.S. PATENT DOCUMENTS

| 6,162,365 | A | 12/2000 | Bhatt et al. |
| 6,248,674 | B1 | 6/2001 | Kamins et al. |
| 7,491,628 | B2 * | 2/2009 | Noca et al. ................... 438/493 |
| 7,785,922 | B2 * | 8/2010 | Robbins ........................ 438/99 |
| 2007/0281156 | A1 | 12/2007 | Lieber et al. |

FOREIGN PATENT DOCUMENTS

JP     2005-46928     2/2005

OTHER PUBLICATIONS

Liu et al. "Enhanced Field Emission Properties of Vertically-oriented Silicon Nanowire Arrays" Journal of Vacuum Science and Technology (China), vol. 25, No. 4, p. 312-314, (2005).

Liu et al. "Synthesis of Silicon Nanowires by Thermally Evaporating Copper Powder" Journal of Materials Science & Engineering (China), vol. 23, No. 4, p. 589-592, (2005).

* cited by examiner

*Primary Examiner* — Kimberly D Nguyen
*Assistant Examiner* — Tony Tran
(74) *Attorney, Agent, or Firm* — Altis Law Group, Inc.

(57) ABSTRACT

A method of synthesizing silicon wires is provided. A substrate is provided. A copper catalyst particle layer is formed on a top surface of the substrate. The reactive device is heated at a temperature of above 450° C. in a flowing protective gas. A mixture of a protective gas and a silicon-based reactive gas is introduced at a temperature above 450° C. at a pressure below 700 Torr to form the silicon wires on the substrate.

11 Claims, 5 Drawing Sheets

METHOD OF SYNTHESIZING SILICON WIRES

RELATED APPLICATIONS

This application is a divisional application of U.S. patent application Ser. No. 11/525,440, filed Sep. 22, 2006, entitled, "METHOD OF SYNTHESIZING SILICON WIRES." U.S. patent application Ser. No. 11/525,440, claims the benefit of priority under 35 U.S.C. 119 from Chinese Patent Application 200610032947.6 filed on Jan. 14, 2006.

BACKGROUND

1. Technical Field

The disclosure relates generally to methods of synthesizing silicon wires and, particularly, to a method of synthesizing silicon wires that employs metallic catalysts.

2. Discussion of Related Art

Since silicon is a favored material in the semiconductor industry and has been used in the IC industry for many years, much attention has already been paid to the research and synthesis of silicon wires. In 1964, micrometer-scaled silicon whiskers grown on silicon substrates were synthesized by a Vapor-liquid-solid (VLS) method. Nowadays, the VLS method is an important way to synthesize silicon wires. In this method, metals, generally selected from gold (Au), nickel (Ni), and iron (Fe), are employed as catalysts.

Although Au is a common catalyst for silicon wires by the VLS method, the use thereof is limited by its expense. Furthermore, in the VLS method employing Au as a catalyst, poisonous, and/or noxious matter is prone to be formed in the process, thereby forming pollutants that must be collected, thus, increasing the environmental control costs associated therewith. The introduction of cheaper metals, such as Fe and Ni, to catalyze the silicon wires has proven to be difficult for at least two reasons. One reason is a high synthesizing temperature (i.e., above 1000° C.) is needed, thereby increasing the cost of the fabrication. Another reason is the catalysts of Fe or Ni are prone to render unwanted impurities within semiconductor elements, thereby decreasing the performance thereof.

What is needed, therefore, is a method of synthesizing silicon wires that overcomes the above-mentioned shortcomings.

BRIEF DESCRIPTION OF THE DRAWINGS

Many aspects of the present method can be better understood with reference to the following drawings. The components in the drawings are not necessarily to scale, the emphasis instead being placed upon clearly illustrating the principles of the present method. Moreover, in the drawings, like reference numerals designate corresponding parts throughout the several views.

The exemplifications set out herein illustrate at least one embodiment of the present method, in one form, and such exemplifications are not to be construed as limiting the scope of such a method in any manner.

DETAILED DESCRIPTION

Reference will now be made to the drawings to describe the synthesizing of silicon wires employing Cu as catalyst according to the present method, in detail.

Figure 1:
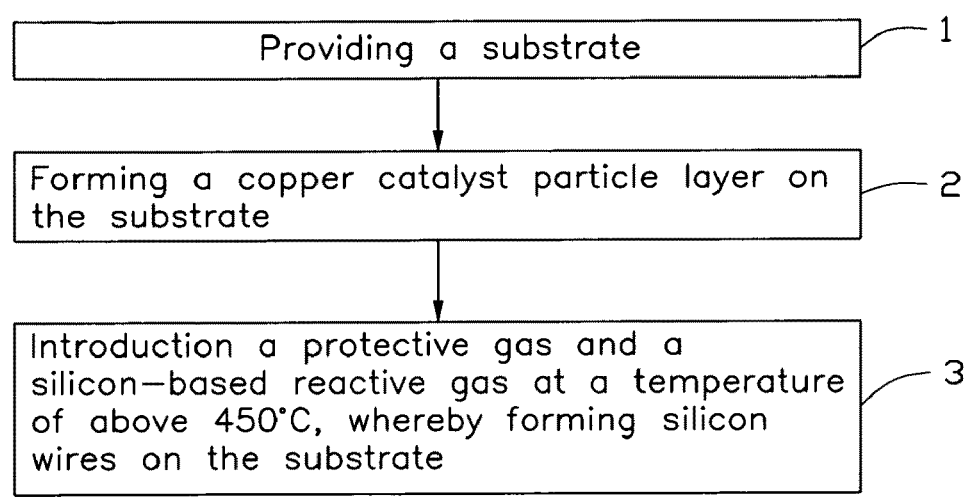
FIG. 1 is a flow chart of one embodiment of a method of synthesizing silicon wires.
Figure 2:
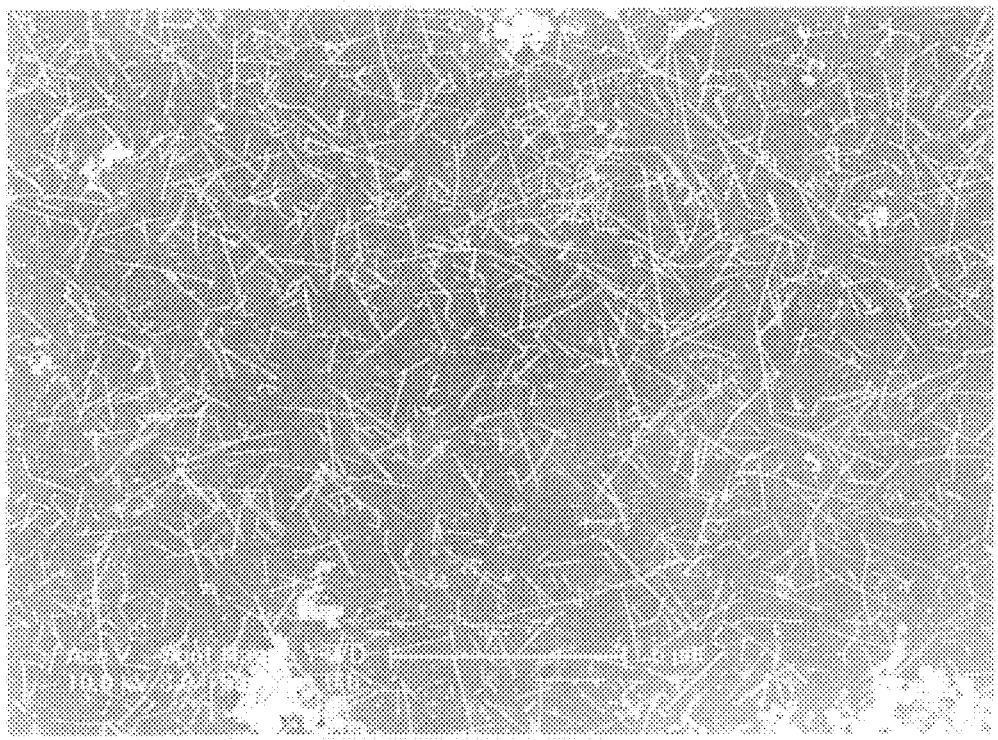
FIG. 2 is a scanning electron microscope (SEM) image of nano-scaled silicon wires synthesized by the method of FIG. 1.
Figure 3:
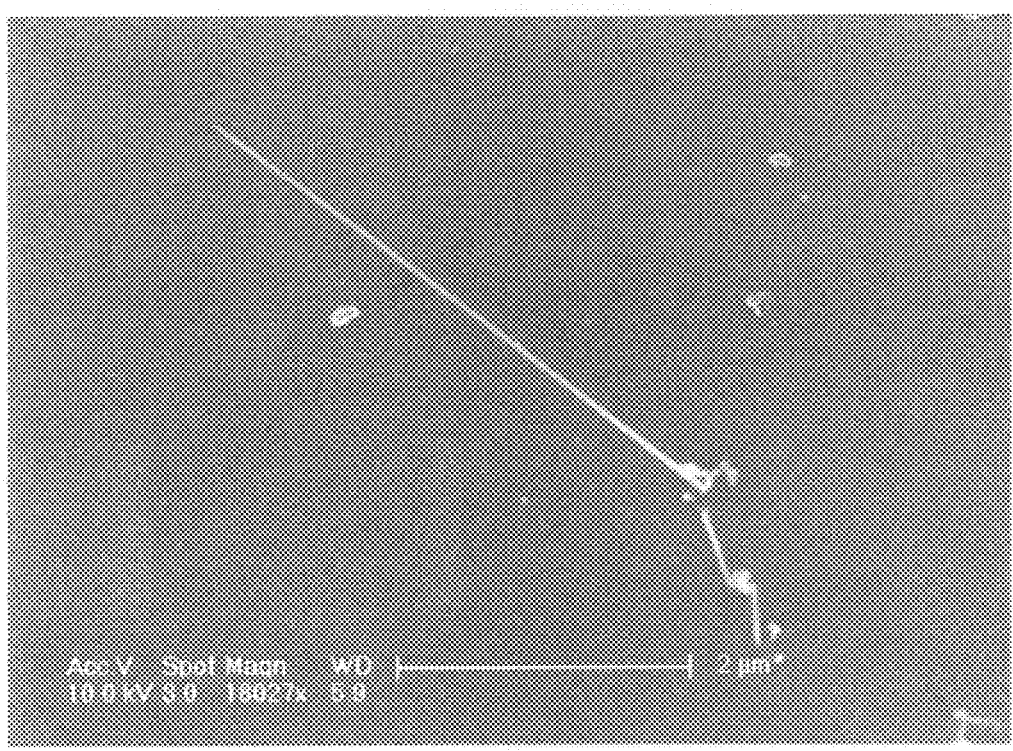
FIG. 3 is an enlarged photo of one of the silicon wires of FIG. 2.
Figure 4:
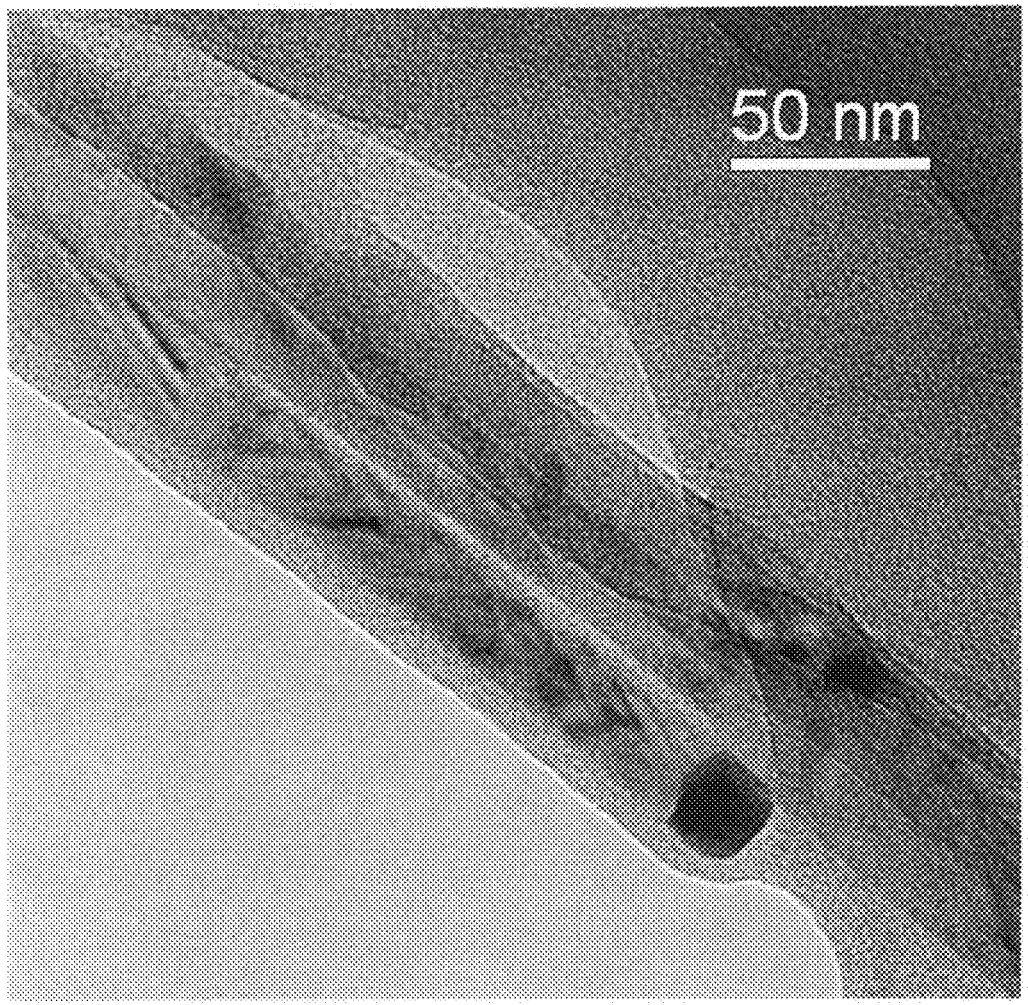
FIG. 4 is a transmission electron microscope (TEM) image of nano-scaled silicon wires synthesized by the method of FIG. 1.
Figure 5:
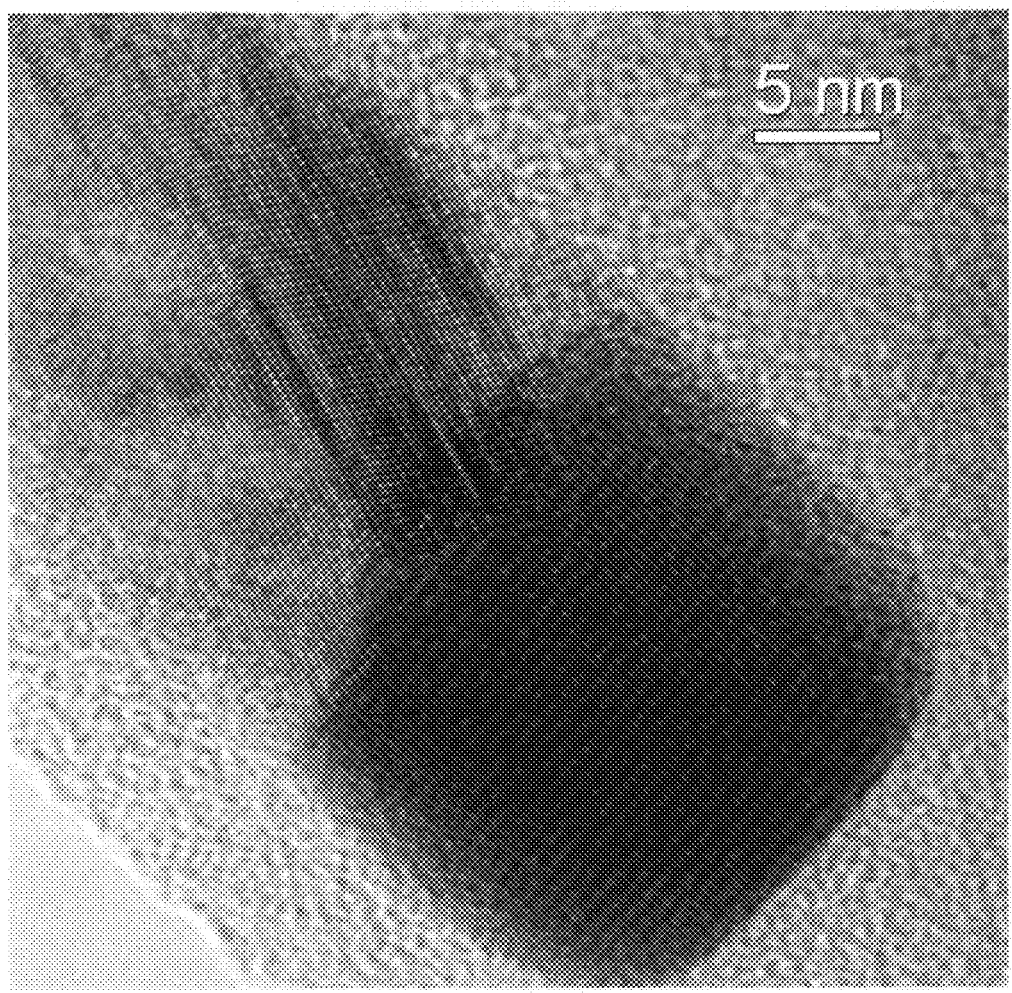
FIG. 5 is an enlarged photo of one of the nano-scaled silicon wires of FIG. 4.

Referring to FIG. 1, a substrate is firstly provided. The substrate is advantageously made from a non-metallic material (e.g. silicon, silicon dioxide, quartz, glass, etc).

Next, a Cu catalyst particle layer is formed on a top surface of the substrate. According to the sizes of the needed silicon wires, the Cu catalyst particles can be selected from one of micro-scale Cu particles, submicro-scale Cu particles, and nano-scale particles, respectively, as the particle size (i.e., diameter) will directly impact the diameter of the wire produced therewith (i.e., a nano-sized copper particle is used to catalyze the growth of a nano-sized diameter silicon wire).

A method of the formation of the Cu catalyst layer generally includes the steps of: (a) depositing a Cu layer on the top surface of the substrate by a physical vapor deposition (PVD) method or a chemical vapor deposition (CVD) method; (b) annealing the substrate with the Cu layer thereon in air at a temperature of about 300° C. to about 400° C. for a sufficient period of time (e.g., about 20 minutes to about 10 hours), thereby oxidizing the Cu layer and forming a Cu oxide particle layer; and (c) heating the substrate up to a predetermined temperature (i.e., above about 500° C.) in a flow of a protective gas (e.g. noble gas, nitrogen) to reduce the Cu oxide particle layer into a Cu particle layer, thereby arriving at the desired Cu catalyst particle layer on the substrate, after having started with an essentially continuous layer of Cu.

An alternative method of the formation of the Cu catalyst layer is to directly deposit Cu particles on the top surface of the substrate by plating or sputtering. Before the deposition of the Cu catalyst particles, the Cu catalyst particles can be formed by an appropriate technology (e.g., a Microwave Plasma chemical vapor deposition (MWPCVD) method, a low pressure flame combustion method, a sol-gel transformation method, etc.).

Another alternative method of the formation of the Cu catalyst layer includes the steps of: (d) applying a powder layer containing a Cu compound (e.g. Cupric Chloride ($CuCl_2$), Cupric Sulfate ($CuSO_4$), etc.) or a liquid-solution layer containing a Cu compound on the top surface of the substrate; and (e) heating the substrate with the powder layer or the liquid-solution layer to decompose the Cu compound to thereby form a Cu catalyst particle layer on the substrate. The step (e) of heating the substrate is selective. The Cu compound could be decomposed to form the Cu catalyst particle layer by a heating step described below, and the step (e) could be omitted.

Then, the substrate with the Cu catalyst particle layer, which is put into a refractory (e.g., quartz, alumina, or platinum) boat, is placed into a high temperature reactive device (e.g., a high-temperature tube furnace, a plasma-enhanced CVD reactive furnace, a hot-filament CVD reactive furnace, etc.). The high temperature reactive device is then heated up to a predetermined temperature (i.e., above about 450° C.) in a flowing protective gas. The protective gas can be a noble gas [e.g., argon (Ar) or helium (He)] and/or nitrogen ($N_2$). Preferably, Ar is used as the protective gas. A mixture of the protective gas and a silicon-based reactive gas is then introduced into the high temperature reactive device for 5 to 30 minutes at a pressure of below about 700 Torr, thereby forming the silicon wires on the substrate. The reactive gas, which can be readily decomposed into silicon at the predetermined temperature, is advantageously selected from silane ($SiH_4$) and silicon monoxide.

Referring to FIGS. 2 to 5, nano-scaled silicon wires formed by the present method are shown. A diameter of each of the nano-scaled silicon wires is in a range of about 10 nanometers to about 100 nanometers, and a diameter of most of the nano-scaled silicon wires is in the range from about 20 nanometers to about 40 nanometers. Each of the nano-scaled silicon wires has a black head, which is formed of an alloy consisting essentially of copper and silicon. The nano-scaled silicon wires shown in FIGS. 2-5 were synthesized using $SiH_4$ as the reactive gas at a temperature of 450° C. to 500° C. and a pressure of about 1 Torr to about 100 Torr.

In the present method, the conventional Fe or Ni is replaced with Cu as the catalyst material used to synthesize silicon wires. Thus, the reactive temperature of synthesis of silicon wires is lower, thereby decreasing the requirement for the thermal performance of the high temperature reactive device. Furthermore, copper is a cheap metal that is readily processed. Therefore, the synthesizing cost of silicon wires is decreased. Moreover, many semiconductor elements employ conductive traces that are made from Cu. As such, given the known compatibility of copper with silicon-based semiconductor elements, the semiconductor elements are unlikely to be adversely polluted by the Cu catalysts, thereby ensuring the performance of the semiconductor elements.

Finally, it is to be understood that the above-described embodiments are intended to illustrate rather than limit the disclosure. Variations may be made to the embodiments without departing from the spirit of the disclosure as claimed. The above-described embodiments illustrate the scope of the disclosure but do not restrict the scope of the disclosure.

What claimed is:

1. A method of synthesizing silicon wires comprising:
    providing a substrate;
    depositing a copper layer on a top surface of the substrate;
    annealing the substrate with the copper layer for a period time sufficient to oxidize the copper layer and to form a copper oxide particle layer;
    reducing the copper oxide particle layer into a copper particle layer, thereby forming the copper catalyst particle layer on the substrate; and
    heating the substrate with the copper catalyst particle layer thereon and introducing a protective gas and a silicon-based reactive gas at conditions including a temperature above about 450° C. and a pressure below about 700 Torr to form the silicon wires on the substrate.

2. The method of claim 1, wherein the copper layer is deposited by a physical vapor deposition method or a chemical vapor deposition method.

3. The method of claim 1, wherein the substrate with the copper layer is annealed in air at a temperature of about 300° C. to about 400° C.

4. The method of claim 1, wherein the copper oxide particle layer is reduced by heating the substrate is up to a temperature above 500° C. in flowing protective gas.

5. The method of claim 1, wherein the protective gas comprises a gas selected from the group consisting of argon, nitrogen, and helium.

6. The method of claim 1, wherein the silicon-based reactive gas comprises a gas selected from the group consisting of silane and silicon monoxide.

7. The method of claim 1, wherein the substrate comprises a material selected from the group consisting of silicon, silicon dioxide, quartz, and glass.

8. The method of claim 1, wherein a pressure of the protective gas and the silicon-based reactive gas ranges from about 1 Torr to about 100 Torr.

9. The method of claim 1, wherein a diameter of each of the silicon wires is in a range of about 10 nanometers to about 100 nanometers.

10. The method of claim 1, wherein a diameter of each of the silicon wires is in a range of about 20 nanometers to about 40 nanometers.

11. A method of synthesizing silicon wires comprising:
    providing a substrate;
    depositing a copper layer on a top surface of the substrate;
    annealing the substrate with the copper layer in air at a temperature of about 300° C. to about 400° C. for a period time sufficient to oxidize the copper layer and to form a copper oxide particle layer;
    heating the substrate up to a temperature above 500° C. in flowing protective gas to reduce the copper oxide particle layer into a copper particle layer, thereby forming the copper catalyst particle layer on the substrate; and
    heating the substrate with the copper catalyst particle layer thereon and introducing a protective gas and a silicon-based reactive gas at conditions including a temperature above about 450° C. and a pressure below about 700 Torr to form the silicon wires on the substrate.

* * * * *